United States Patent [19]
Pearson

[11] Patent Number: 5,401,318
[45] Date of Patent: Mar. 28, 1995

[54] PLASMA REACTOR FOR PERFORMING AN ETCHING OR DEPOSITION METHOD

[75] Inventor: David Pearson, Annecy, France

[73] Assignee: Alcatel CIT, Paris, France

[21] Appl. No.: 291,710

[22] Filed: Aug. 16, 1994

[30] Foreign Application Priority Data

Aug. 27, 1993 [FR] France .................. 93 10301

[51] Int. Cl.⁶ ............................................. C23C 16/00
[52] U.S. Cl. ............................. 118/723 AN; 156/345
[58] Field of Search .......... 118/723 I, 723 E, 723 AN, 118/723 MA; 156/345; 204/298.08, 298.16, 298.37

[56] References Cited

U.S. PATENT DOCUMENTS

| | | | |
|---|---|---|---|
| 4,810,935 | 3/1989 | Boswell | 315/111.4 |
| 4,990,229 | 2/1991 | Campbell | 204/298.0 |
| 5,091,049 | 2/1992 | Campbell | 156/643 |
| 5,122,251 | 6/1992 | Campbell | 204/298.0 |
| 5,280,154 | 1/1994 | Cuomo | 219/121.5 |

FOREIGN PATENT DOCUMENTS

| | | |
|---|---|---|
| 0403418A3 | 12/1990 | European Pat. Off. . |
| 0489407A3 | 6/1992 | European Pat. Off. . |
| 234392 | 8/1991 | Japan .............. 118/723 AN |

OTHER PUBLICATIONS

French Search Report FR 9310301.

*Primary Examiner*—R. Bruce Breneman
*Assistant Examiner*—Joni V. Chang
*Attorney, Agent, or Firm*—Sughrue, Mion, Zinn, Macpeak & Seas

[57] ABSTRACT

A plasma reactor for performing an etching or deposition method, said reactor including a vacuum enclosure designed to receive a substrate to be treated, and including means for inserting a gas to be ionized, the plasma, which is produced in a container, being excited by an antenna fed by a radio-frequency power generator, wherein said antenna is composed of an electrical conductor that constitutes a single circular loop having two diametrically-opposite points connected to feed conductors.

5 Claims, 2 Drawing Sheets

PLASMA REACTOR FOR PERFORMING AN ETCHING OR DEPOSITION METHOD

The present invention relates to a plasma reactor for performing an etching or deposition method.

BACKGROUND OF THE INVENTION

It is known that when such machines are of the type having inductive plasma exciters they enable much higher ion densities to be obtained, of the order of 100 times higher than machines of the capacitive excitation type.

For example, Document WO 86/06923 discloses a machine of the inductive exciter type in which the exciter antenna couples radio-frequency energy to a cylindrical volume, and over a length greater than 200 mm.

For the excitation source, that layout provides high ion density at low pressures, while the radial profile of the ion density in the source or close to the plasma-forming zone is not uniform.

In order to produce a uniform ion density profile over the substrate to be treated, the substrate is placed remote from the source in a diffusion plasma region. The plasma has an ion density that is low, or extremely low for electronegative gases such as $SF_6$, $C_2F_6$ or $Cl_2$ for which density drops rapidly as a function of pressure (below about $10^{-3}$ mbars), and of distance between the source and the substrate. Such gases are typically used at pressures greater than $10^{-2}$ mbars for deep fast etching or for PECVD (Plasma Enhanced Chemical Vapor Deposition).

Document EP 0 431 282 also discloses a machine of the inductive exciter type in which the exciter antenna is plane and has the shape of a spiral coil.

That layout provides good ion uniformity for the excitation source. Compared with other known inductive sources, it provides better uniformity at high pressures (greater than $10^{-2}$ mbars). Compared with other known inductive sources, it also provides better ion densities when electronegative gases are used such as $SF_6$, $C_2F_6$, and $Cl_2$, as mentioned above.

However, with such an antenna as the plasma excitation source, the electromagnetic field is relatively strong at a distance remote from the antenna, thereby imparting high energy to the ionized particles, and, in the case of etching, this might damage the substrate to be etched.

Document EP 0 403 418 describes high density plasma etching and deposition apparatus in which the exciter antenna is constituted by two circular loops situated one above the other and parallel to the substrate to be treated.

The two loops are interconnected by conductors and the resulting assembly is fed by a radio-frequency power generator. The antenna is disposed around a dielectric tube made of quartz.

However, with such a layout, high levels of erosion have been observed on the tube where the conductors interconnect the two loops.

OBJECTS AND SUMMARY OF THE INVENTION

An object of the present invention is to mitigate the drawbacks of the above-mentioned existing machines, and the invention provides a plasma reactor for performing an etching or deposition method, said reactor including a vacuum enclosure designed to receive a substrate to be treated, and including means for inserting a gas to be ionized, the plasma, which is produced in a container, being excited by an antenna fed by a radio-frequency power generator, wherein said antenna is composed of an electrical conductor that constitutes a single circular loop having two diametrically-opposite points connected to feed conductors.

According to another characteristic, said radio-frequency power generator feeds said antenna via an impedance-matching circuit comprising a first variable capacitor connected in series with a second variable capacitor connected in parallel across the terminals of said antenna.

BRIEF DESCRIPTION OF THE DRAWINGS

Other characteristics of the present invention will appear on reading the following description of an embodiment of the invention given with reference to the accompanying drawings, in which.

MORE DETAILED DESCRIPTION

Figure 1:
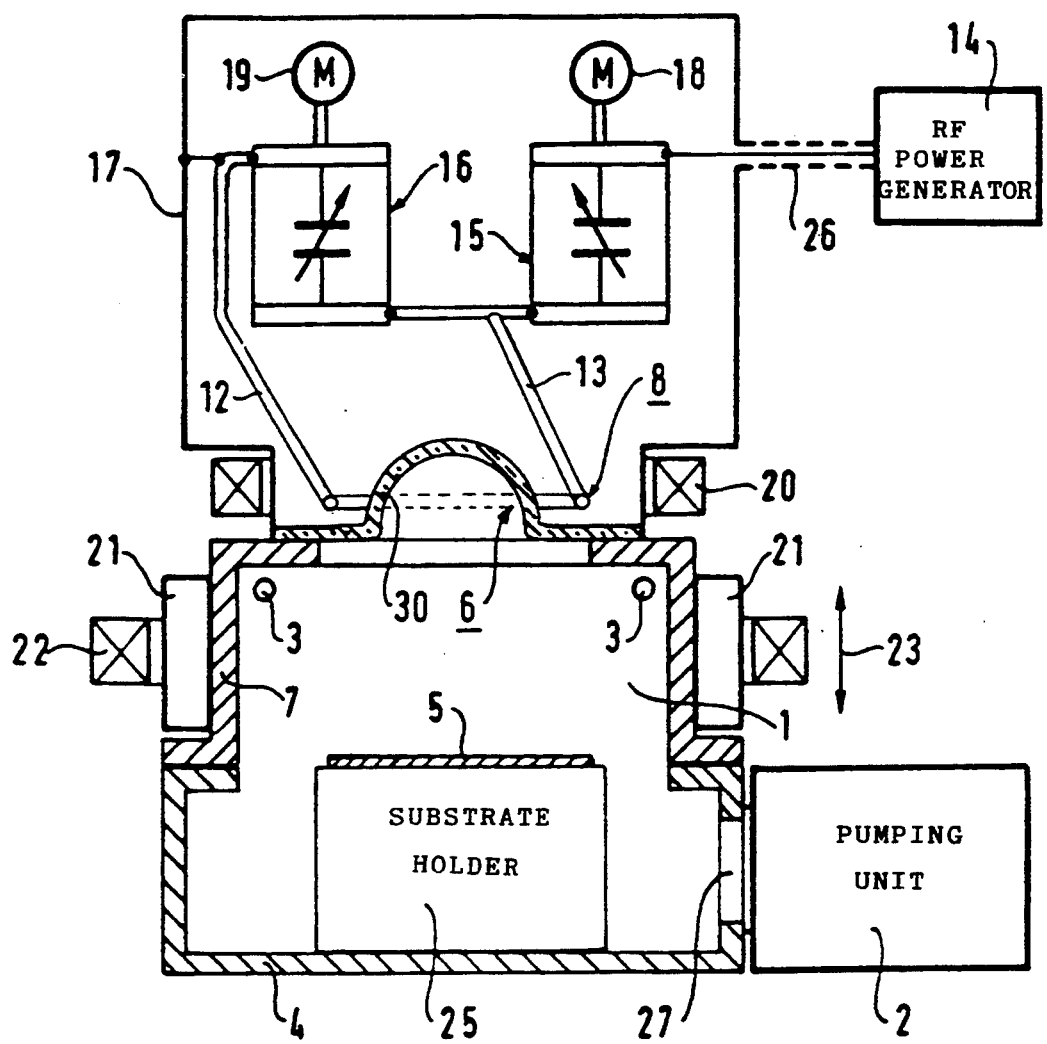
FIG. 1 is a diagram showing a plasma reactor of the invention.
Figure 2:
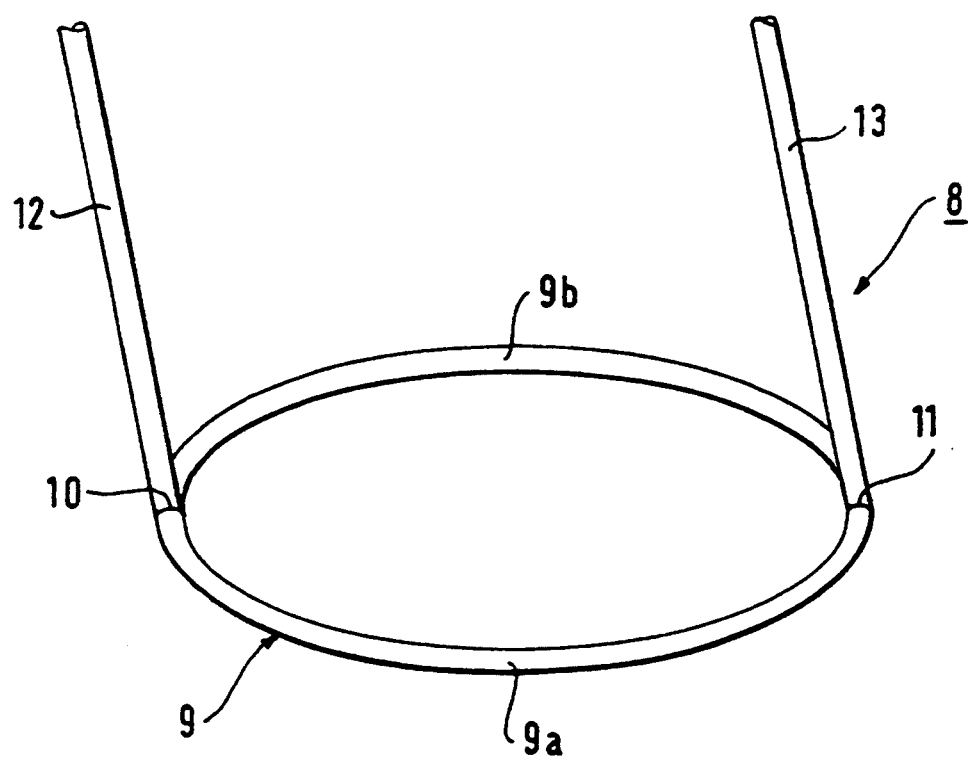
FIG. 2 is an enlarged view showing the exciter antenna of the invention.

With reference to FIG. 1, the plasma reactor essentially comprises a vacuum enclosure 1 pumped out by a pumping unit 2. Holes 3 make it possible to insert a treatment gas to be ionized, e.g. $SF_6$, $C_2F_6$, or $Cl_2$, etc.

The enclosure is closed at its bottom by a bottom compartment 4 provided with an orifice 27 for connecting the enclosure to the pumping unit 2. The bottom compartment 4 is provided with a substrate-holder 25 which, depending on the treatment method to be performed (deposition or etching), enables the substrate 5 to be polarized, heated or cooled, and to be vertically positioned.

At its top, the enclosure is closed by a container 6 in the shape of a dome with a rim, and made of quartz or of another dielectric material that is compatible with the treatment. The side wall 7 of the enclosure 1 is made of a non-magnetic material.

For generating the plasma inside the enclosure 1, the excitation source is constituted by an antenna 8 surrounding the hemispherical portion 30 of the plasma container 6.

The antenna 8 is composed of an electrical conductor 9 constituting a single circular loop having two diametrically opposite points 10 and 11 that are connected to the feed conductors 12 and 13, which thus feed the two halves 9a and 9b of the loop 9 in parallel.

The feed conductors 12 and 13 are connected to a 13.56 MHz radio-frequency power generator 14 via an impedance-matching circuit including a first variable capacitor 15 connected directly to the generator 14, and connected in series to a terminal of a second variable capacitor 16 connected in parallel across the terminals of the antenna 8, and having its second terminal connected to the return 26 of the radio-frequency generator 14 which is electrically connected to the ground-forming frame 17. The variable capacitors 15 and 16 are set by motors 18 and 19 controlled by an automatic or manual impedance-matching circuit. The antenna 8 is advantageously water cooled.

A first electric coil 20 is placed around the antenna 8 so as to produce a magnetic field that is perpendicular to the plane of the antenna 8.

Permanent magnets 21 are also placed all around the enclosure 1, which magnets are polarized radially and successively in opposite directions from one another, so as to form a "multi-pole" confinement field for the plasma.

A second electric coil 22 is also disposed around the enclosure 1 so as to produce a magnetic field that is perpendicular to a plane situated between the antenna 8 and the substrate 5, and parallel to the substrate. The positioning of the second coil 22 is adjustable as indicated by double-headed arrow 23. The coils 20 and 22, which DC-powered, serve to optimize the intensity and the uniformity of the plasma and of the method at the substrate 5.

For the source of the invention (the antenna 8), since the volume of the container 6 in which the plasma is produced is small compared with the cylindrical source described in the first-mentioned prior art document in the introduction, the radio-frequency power is coupled more effectively to the plasma, and, as a result, the efficiency in terms of total ion flux per watt is higher than with such sources.

By means of the two semicircular halves 9a and 9b of the antenna 8 that are fed in parallel, the inductance of the antenna is significantly lower than with the antennas in the prior art documents mentioned in the introduction. As a result, firstly a weaker electric field is induced in the plasma, thereby minimizing the energy of the charged particles at the substrate 5, and secondly the transfer of power from the radio-frequency generator to the plasma is more effective.

The presence of the static magnetic field produced by the coils 20, 22 makes it possible to generate standing resonant waves in the plasma, which waves increase the efficiency and the effectiveness of coupling the radio-frequency energy to the electrons of the plasma. The energy of the electrons, which are thermalized, is transferred to the plasma by collisions, hence the high ion density.

The plasma produced by the plasma reactor of the invention may be used for methods of performing reactive and selective ion etching, spray cleaning, or plasma enhanced chemical vapor deposition (PECVD) in which thin layers are deposited on the substrate.

I claim:

1. A plasma reactor for performing an etching or deposition method, said reactor including a vacuum enclosure designed to receive a substrate to be treated, and including means for inserting a gas to be ionized, the plasma, which is produced in a container, being excited by an antenna fed by a radio-frequency power generator, wherein said antenna is composed of an electrical conductor that consisting of a single circular loop having two diametrically-opposite points connected to feed conductors.

2. A plasma reactor according to claim 1, wherein said radio-frequency power generator feeds said antenna via an impedance-matching circuit comprising a first variable capacitor connected in series with a second variable capacitor connected in parallel across the terminals of said antenna.

3. A plasma reactor according to claim 1, wherein a plurality of permanent magnets are disposed around said vacuum enclosure, said magnets being polarized radially and successively in opposite directions from one another.

4. A plasma reactor according to claim 1, wherein a DC-powered electrical coil is disposed around said enclosure, the axis of said coil being perpendicular to the plane of said antenna, the position of said coil being adjustable along said axis.

5. A plasma reactor according to claim 1, wherein a DC-powered electrical coil is disposed around said antenna, the axis of said coil being perpendicular to the plane of the antenna.

* * * * *